United States Patent
Marcuse et al.

(10) Patent No.: US 6,573,702 B2
(45) Date of Patent: *Jun. 3, 2003

(54) METHOD AND APPARATUS FOR CLEANING ELECTRONIC TEST CONTACTS

(75) Inventors: Arno G. Marcuse, Tempe, AZ (US); Robert A. Most, Newfoundland, NJ (US); Edward S. North, Los Altos, CA (US)

(73) Assignee: New Wave Research, Fremont, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/928,806

(22) Filed: Sep. 12, 1997

(65) Prior Publication Data

US 2001/0007421 A1 Jul. 12, 2001

(51) Int. Cl.[7] ............................... G01R 1/073; B08B 7/00
(52) U.S. Cl. ........................... 324/158.1; 134/1; 134/5; 324/757
(58) Field of Search .............................. 324/158.1, 757, 324/754; 134/1, 5

(56) References Cited

U.S. PATENT DOCUMENTS

| | | | | |
|---|---|---|---|---|
| 3,628,144 A | * | 12/1971 | Aronstein et al. | 324/757 |
| 3,770,336 A | | 11/1973 | Roess | 350/3.5 |
| 3,782,823 A | | 1/1974 | Kantorski et al. | 356/85 |
| 3,997,358 A | * | 12/1976 | Taylor | 134/7 |

(List continued on next page.)

FOREIGN PATENT DOCUMENTS

| | | |
|---|---|---|
| DE | 4029530 | 3/1992 |
| JP | 62-124086 | 6/1987 |
| JP | 63-154280 | 6/1988 |
| JP | 1-192492 | 8/1989 |
| JP | 2-192885 | 7/1990 |
| JP | 5-192779 | 8/1993 |
| JP | 6-106378 | 4/1994 |

OTHER PUBLICATIONS

Accuprobe website, "Probe Tips—A Technical Bulleting for Probing Applications", http://www.accuprobe.com/technic/resist.htm, pp. 1–4, printed from website Aug. 22, 1997.

Accuprobe website, "Probe Tips—A Technical Bulleting for Probing Applications Fixed Pattern Probe Card", http://www.accuprobe.com/technic/pattern.htm, pp. 1–2, printed from website Aug. 22, 1997.

(List continued on next page.)

Primary Examiner—Ernest Karlsen
(74) Attorney, Agent, or Firm—Wilson Sonsini Goodrich & Rosati

(57) ABSTRACT

A method and device for cleaning an electrical contact. Semiconductor testing device. Process of manufacturing integrated circuits. The electrical contact is used for contacting an integrated circuit and accumulates debris during use. The method comprises directing electromagnetic radiation at the contact. The electromagnetic energy reacts with at least one of the contact and the debris so as to cause at least a portion of the debris on the contact to be removed. The electromagnetic radiation may comprise coherent radiation, such as electromagnetic radiation generated using a laser. The portion of the debris may comprise organic debris, aluminum oxide, polyimide, or other debris. According to one aspect of the invention, the contact comprises a conductive material and the electromagnetic radiation causes removal of the portion of the debris substantially without removal of the conductive material. According to another aspect of the invention, the electromagnetic radiation at least partially melts the conductive material. In one preferred system, the contact comprises a probe tip. In such a system the probe tip may comprise the tip of a probe needle mounted to a probe card used for testing integrated circuits.

2 Claims, 6 Drawing Sheets

U.S. PATENT DOCUMENTS

| | | | |
|---|---|---|---|
| 4,141,456 A | 2/1979 | Hart | 214/1 R |
| 4,182,024 A | 1/1980 | Cometta | 29/571 |
| 4,229,710 A | 10/1980 | Shoshan | 331/94.5 |
| 4,346,314 A | 8/1982 | Craxton | 307/427 |
| 4,530,600 A | 7/1985 | Lopez | 356/5 |
| 4,590,422 A * | 5/1986 | Milligan | 324/754 |
| 4,778,263 A | 10/1988 | Foltyn | 350/377 |
| 4,864,227 A | 9/1989 | Sato | 324/158 |
| 4,879,479 A | 11/1989 | Frazier et al. | 307/425 |
| 4,965,865 A | 10/1990 | Trenary | 324/158 |
| 4,976,930 A | 12/1990 | Kishida et al. | 422/186.3 |
| 5,047,668 A | 9/1991 | Bosenberg | 359/330 |
| 5,059,764 A | 10/1991 | Baer | 219/121.68 |
| 5,065,092 A | 11/1991 | Sigler | 324/158 |
| 5,070,297 A | 12/1991 | Kwon et al. | 324/158 |
| 5,083,007 A | 1/1992 | Spletter et al. | 219/121.64 |
| 5,144,630 A | 9/1992 | Lin | 372/22 |
| 5,151,909 A | 9/1992 | Davenport et al. | 372/22 |
| 5,231,263 A | 7/1993 | Kuwabara et al. | 219/121.68 |
| 5,247,389 A | 9/1993 | Beausoleil | 359/326 |
| 5,266,889 A | 11/1993 | Harwood et al. | 324/158 F |
| 5,293,516 A | 3/1994 | Fouere et al. | 324/158 |
| 5,321,352 A | 6/1994 | Takebuchi | 324/158 |
| 5,341,236 A | 8/1994 | Stappaerts | 359/328 |
| 5,361,275 A | 11/1994 | Opower | 372/108 |
| 5,365,034 A | 11/1994 | Kawamura et al. | 219/121.83 |
| 5,373,140 A * | 12/1994 | Nagy et al. | 219/121.68 |
| 5,389,761 A * | 2/1995 | Kresse, Jr. | 134/5 |
| 5,399,983 A | 3/1995 | Nagasawa | 324/758 |
| 5,519,724 A | 5/1996 | Tatah | 372/102 |
| 5,521,518 A | 5/1996 | Higgins | 324/754 |
| 5,525,912 A | 6/1996 | Momohara | 324/754 |
| 5,592,879 A * | 1/1997 | Waizmann | 134/1 |
| 5,594,357 A | 1/1997 | Nakajima | 324/758 |
| 5,595,668 A * | 1/1997 | Madden, Jr. et al. | 216/17 |
| 5,611,946 A | 3/1997 | Leong et al. | 219/121.6 |
| 5,658,148 A * | 8/1997 | Neuberger et al. | 433/215 |
| 5,666,063 A | 9/1997 | Abercrombie et al. | 324/754 |

OTHER PUBLICATIONS

Accuprobe website, "Probe Tips—A Technical Bulleting for Probing Applications; Tip Material, Size & Shape", http://www.accuprobe.com/technic/material.htm, pp. 1–3, printed from website Aug. 22, 1997.

Product Literature, "Excimer Laser Cutter Attachment," Model LCM–308, by Florod Corporation, Gardena, CA, Published Prior to Sep. 12, 1996.

Product Literature, "for Profile Analysis Sample Preparation Suss Manual Scribers," Karl Suss America, Inc. Waterbury Center, VT, Published Prior to Sep. 12, 1996.

J.C. Ion et al., "Laser Beam Welding Using Filler Wire," http://www.industrial–lasers.com/, Feb., 2001, pp. 1–4.

John F. Ready, "Interaction of High–Power Laser Radiation with Materials," Industrial Application of Lasers Second Edition, Academic Press, (Month Unavailable) 1997, pp. 315–342.

* cited by examiner

METHOD AND APPARATUS FOR CLEANING ELECTRONIC TEST CONTACTS

BACKGROUND OF THE INVENTION

1. Field of the Invention

The present invention relates to the field of methods and systems for manufacturing and testing integrated circuits using probe cards or other probe elements; and more particularly the present invention relates to the field of cleaning and reusing probes used in such manufacturing and testing.

2. Description of Related Art

During manufacturing of integrated circuits, devices known as probe cards are used to test the characteristics of a fabricated integrated circuit chip formed on a semiconductor wafer. Probe cards comprise a circuit board (or other structure) and an array of probe wires connected to test circuits on the circuit board. The probe wires are arranged so that the tips line up with contact pads on the chips to be tested. The probe card is positioned to cause electrical contact between the test circuits and the pads on an integrated circuit on the wafer.

To test the integrated circuits on a wafer, the probe card typically is set into an integrated circuit testing machine, and wafers containing integrated circuits are placed in the machine below the probe card. The probe card is placed to cause contact of probe tips on a selected circuit on the wafer, and tests are executed. It is important that the probe tips of the probe needles of the probe card make accurate and good electrical connection with the contact pads of the circuit under test. To achieve good and accurate connections, it is important that the needles be properly aligned and that the probe tips be clean and electrically conductive.

For a discussion of probe cards, see U.S. Pat. No. 4,864,227, invented by Mitsuya Sato, entitled WAFER PROBER. For a discussion of wafer probing equipment, see U.S. Pat. No. 5,525,912, invented by Tomomi Momohara, entitled PROBING EQUIPMENT AND PROBING METHOD.

During use, probe tips of the probe cards accumulate debris, which increases contact resistance and otherwise degrades performance of the probe card. According to one prior art technique, probe cards are cleaned using a solvent while an operator views the probe cards under a microscope and cleans the probe tips individually. Other prior methods used mechanical scrubbing of probe tips to remove debris. Such methods are time consuming and subject the probe tips to misalignment and wear.

It is therefore desirable to clean probe tips in a way so as to allow for reuse of the probe cards, minimize the damage to the probe tips, and reduce risk of misalignment of probe tips. Also, it is desirable to allow probe cards longer life and to reduce interruption of integrated circuit manufacturing due to replacement of probe cards.

Thus, there is a need for an improved method of cleaning probe cards.

SUMMARY OF THE INVENTION

The present invention provides a method of cleaning an electrical contact. The electrical contact is used for contacting an integrated circuit and accumulates debris during use. The method comprises directing electromagnetic radiation at the contact. The electromagnetic energy reacts with at least one of the contact and the debris so as to cause at least a portion of the debris on the contact to be removed.

The electromagnetic radiation may comprise coherent radiation, such as electromagnetic radiation generated using a laser. The portion of the debris may comprise organic debris, aluminum oxide, polyimide, silicon dioxide, nitride, or other debris. According to one aspect of the invention, the contact comprises a conductive material and the electromagnetic radiation causes removal of the portion of the debris substantially without removal of the conductive material. According to another aspect of the invention, the electromagnetic radiation at least partially melts the conductive material.

The wavelength of the electromagnetic radiation is selected to remove debris. In one system, the wavelength is selected to bring contact resistance of the probe tip below 2 Ohms. In another system, the wavelength is selected to bring contact resistance of the probe tip below 5 Ohms. The electromagnetic radiation may comprise a wavelength in the ultraviolet range of the electromagnetic spectrum, or alternatively, a wavelength in the green range of the electromagnetic spectrum.

The contact has a diameter and the electromagnetic radiation comprises a beam of energy, where the beam has a diameter greater than the diameter of the contact. In one system the contact has a diameter less than 45 microns and the electromagnetic radiation comprises a beam of energy capable of removing debris, where the beam has a diameter greater than 25 microns.

In one preferred system, the contact comprises a probe tip. In such a system the probe tip may comprise the tip of a probe needle mounted to a probe card used for testing integrated circuits.

The invention provides a method of cleaning a probe tip on a card including placing the card into a probe card analyzer and, while the card is in the probe card analyzer, directing electromagnetic radiation at the probe tip. The electromagnetic energy reacts with at least one of the probe tip and the debris so as to cause at least a portion of the debris on the probe tip to be removed. A test is executed on the probe card while the probe card is in the probe card analyzer. Based on the test, it is determined whether to direct radiation at a second contact on the card. According to another aspect of the invention, resistance of a second contact on the card is measured, and electromagnetic radiation is directed at the second contact if the resistance is outside a particular operating range for probe tips. The particular operating range may be between 0 and 1 Ohm, between 0 and 250 miliohms, between 0 and 100 miliohms, or other range or subrange.

The invention provides a device for cleaning electrical contacts on test cards which comprises a source of electromagnetic radiation, optics optically coupled to the source of electromagnetic radiation, and a test card holder. The test card holder is positioned relative to the optics allowing electromagnetic radiation from the source of electromagnetic radiation to be directed onto a contact on a test card positioned in the test card holder. According to an aspect of the invention, the contact comprises a probe tip and the test card comprises a probe card.

The device, according to one aspect of the invention, comprises a movable stage coupled to the card holder movable to position the contacts on the card relative to the optics. Further, the device may comprise a display for viewing the probe tips coupled to the optics. According to another aspect of the invention, the source of electromagnetic radiation comprises a laser, such as a gas or solid state laser. The laser may be one of various types such as a xenon laser, $CO_2$ laser, nitrogen laser, excimer laser, or frequency doubled or tripled Nd:YAG laser.

The present invention provides a process of manufacturing integrated circuits which includes fabricating a plurality of integrated circuits and contacting pads of the integrated circuits with a plurality of electrical contacts which accumulate debris during use. The integrated circuits are tested using the plurality of electrical contacts and packaged. Electromagnetic radiation is directed at at least one contact in the plurality of electrical contacts and reacts with at least one of the contact and the debris on the contact to cause at least a portion of the debris on the contact to be removed. A second plurality of integrated circuits is tested using the plurality of electrical contacts and packaged.

The invention includes a semiconductor testing device including a source of electromagnetic radiation directable to at least an electrical contact among the electrical contacts on the device. The device includes test electronics, a test card coupled to the test electronics. The test card includes electrical contacts that accumulate debris during use. The device also includes a semiconductor holder positioned relative to the test card.

DETAILED DESCRIPTION

Figure 1:
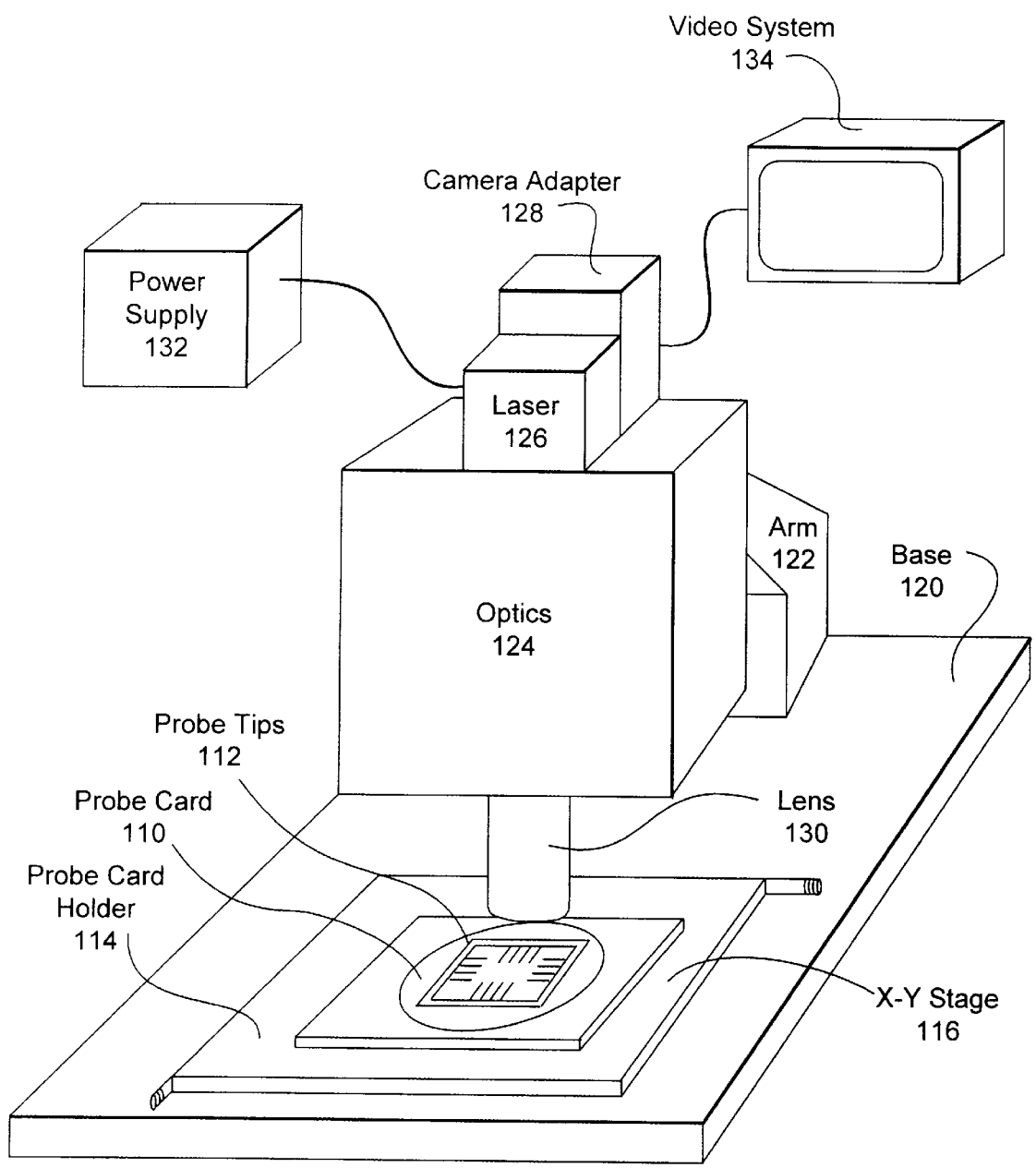
FIG. 1 is a perspective view of a device for cleaning electrical contacts including a laser according to an embodiment of the present invention.

One embodiment of the invention provides a method for cleaning probe tips of probe cards, which are used in a testing machine to test integrated circuits. Debris accumulates on probe tips during use. The probe cards are removed from the testing machine. Laser radiation is directed onto the probe tips of the probe card to vaporize debris from the probe tips. The probe card is returned to the integrated circuit tester and reused to test integrated circuits. An embodiment of the invention includes a device for cleaning probe tips with laser energy. The device includes a laser, optics through which laser radiation is directed, and a probe card holder for holding the probe card in place while laser radiation is directed at the probe tips. FIG. 1 is a perspective view of a device for cleaning electrical contacts including a laser according to an embodiment of the present invention. In FIG. 1, a probe card 110 is shown schematically, mounted on a probe card holder 114. The probe card 110 includes probe tips 112. Probe card holder 114 is mounted on an X-Y stage 116. X-Y stage 116 is mounted on base 120, to which arm 122 is attached. Optics 124 are attached to arm 122. Laser 126 and camera adapter 128 are coupled with optics 124. Lens 130 is coupled to optics 124. Power supply 132 is coupled to laser 126. Camera adapter 128 is coupled to video system 134.

Probe card 110 is obtained from an integrated circuit tester, normally after the probe card has been determined to no longer function properly. Probe card 110 is mounted to probe card holder 114 which is adapted to receive and secure probe card 110 so that it can be viewed and cleaned with the cleaning device. X-Y stage 116 allows for movement of probe card holder 114 thus enabling the operator to move various probe tips from among probe tips 112 to within a field of view and within an area that can be irradiated with laser radiation from lens 130. X-Y stage may be a manually operated stage or other device that allows for movement of probe card holder with respect to lens. Alternatively, lens 130 or optics 124 may be moved with respect to probe card holder 114 or probe tips 112 to allow laser energy to be directed to various probe tips. The laser beam may also be moved with respect to probe card holder 114 or probe tips 112. Probe card holder 114 may be a device adapted specifically to receive and hold a particular probe card, or it may be a general purpose probe card holder adapted to receive a variety of probe cards.

X-Y stage may be automatically controlled. A computer may be coupled to X-Y stage. By running preprogrammed instructions on the computer, the X-Y stage may be automatically moved. When the X-Y stage is automatically controlled, the probe cards may be automatically moved into positions at which laser energy may be directed to individual probe tips.

Lens 130 focuses laser energy from laser 126 through optics 124 onto probe tips 112. Further, lens 130 provides an optical path for an image of probe cards 110 and probe tips 112 into optics 124 and into camera adapter 128. Camera adapter 128 is coupled to optics 124 in order to provide the interface for a camera or video system 134 which can be used to view probe tips 112 and probe card 110. Alternatively, probe card 110 may be viewed through optics 124 if optics 124 are adapted for direct microscopic viewing rather than for viewing via video system 134. Optics 124 and lens 130 allow an operator to view probe card 110 under magnification.

Thus, optics 124 and lens 130 are adapted to allow for laser energy to be focused onto probe tips 112 and also to allow an operator to view probe card 110 and in particular probe tips 112. For a discussion of optics for viewing integrated circuits and similar objects, the optics also being adapted for use with a laser, see U.S. Pat. No. 5,611,946, entitled MULTI-WAVELENGTH LASER SYSTEM, PROBE STATION AND LASER CUTTER SYSTEM USING THE SAME, invented by Tony Leong, Edward S. North, Richard L. Herbst, which is incorporated herein by reference in its entirety ("the '946 patent"). In particular, please refer to FIGS. 2a and 2b of the '946 patent, for a discussion of a laser and optics adapted for use with the laser and for microscopic viewing. Optics 124 include a beam splitter that allows optics 124 to direct laser radiation from laser 126 to probe tips 112 simultaneously, while optics 124 are used for viewing an image of probe card 110 via camera adapter 128 and video system 134.

Optics 124 may include an additional beam splitter and lower magnification optics. The additional beam splitter and lower magnification optics direct an image to an additional camera. This additional camera provides a view of a larger area and will allow an operator to see a portion of or all of the probe tip area.

A single lens 130 may be used in connection with optics 124. Alternatively, multiple lenses may be provided. With multiple lenses, the lenses can be interchanged so as to allow for less magnification during positioning of probe card 110 into view and greater magnification for cleaning of probe tips 112 with laser radiation 210.

Laser 126 is a source of electromagnetic radiation. Laser 126 provides electromagnetic radiation with a wavelength of 355 or 532 nanometers or both 355 and 532 nanometers. A probe tip is irradiated by laser 926 with 3 to 5 pulses of such radiation having energy in the range of 60 to 5000 milijoules per square centimeter per pulse or 500 to 1500 milijoules per square centimeter per pulse. Laser 926 provides an output of 30 pulses per second. Laser 126 comprises a flash lamp pumped electro-optically Q switched Nd:YAG laser. In one embodiment the energy is 1100 milijoules per square centimeter and is in the green range of the electromagnetic spectrum. In another embodiment the energy is 750 milijoules per square centimeter and is in the ultraviolet range of the electromagnetic spectrum.

In various embodiments, laser 126 comprises a class IIIB laser, a class IV laser, or other laser. Laser 126 may provide radiation having a wavelength in the range of 200 to 3000 nanometers, in the range of 400 to 700 nanometers, or other wavelength, range, or subrange of wavelengths. For example, laser 126 may provide radiation with wavelengths of 266 nanometers, 355 nanometers, or 1064 nanometers. Alternatively, laser 126 may comprise a multiwavelength laser. Laser 126 may be provided as a diode pump laser, which, for example, may provide 35 nanosecond pulses at a frequency in a range of 1000 to 2000 pulses per second. Pulses from laser 126 may be of differing lengths, such as the following: 7 nanoseconds (e.g., for infrared), 6 nanoseconds (e.g., for green), 5 nanoseconds (e.g., for ultraviolet), or other pulse length in various combinations with wavelengths. Laser 126 also may comprise a xenon laser or other laser.

In an embodiment of the invention, electromagnetic radiation is emitted through optics 124 from a source of electromagnetic radiation other than a laser, and this radiation is used to clean probe tips 112.

Figure 2:
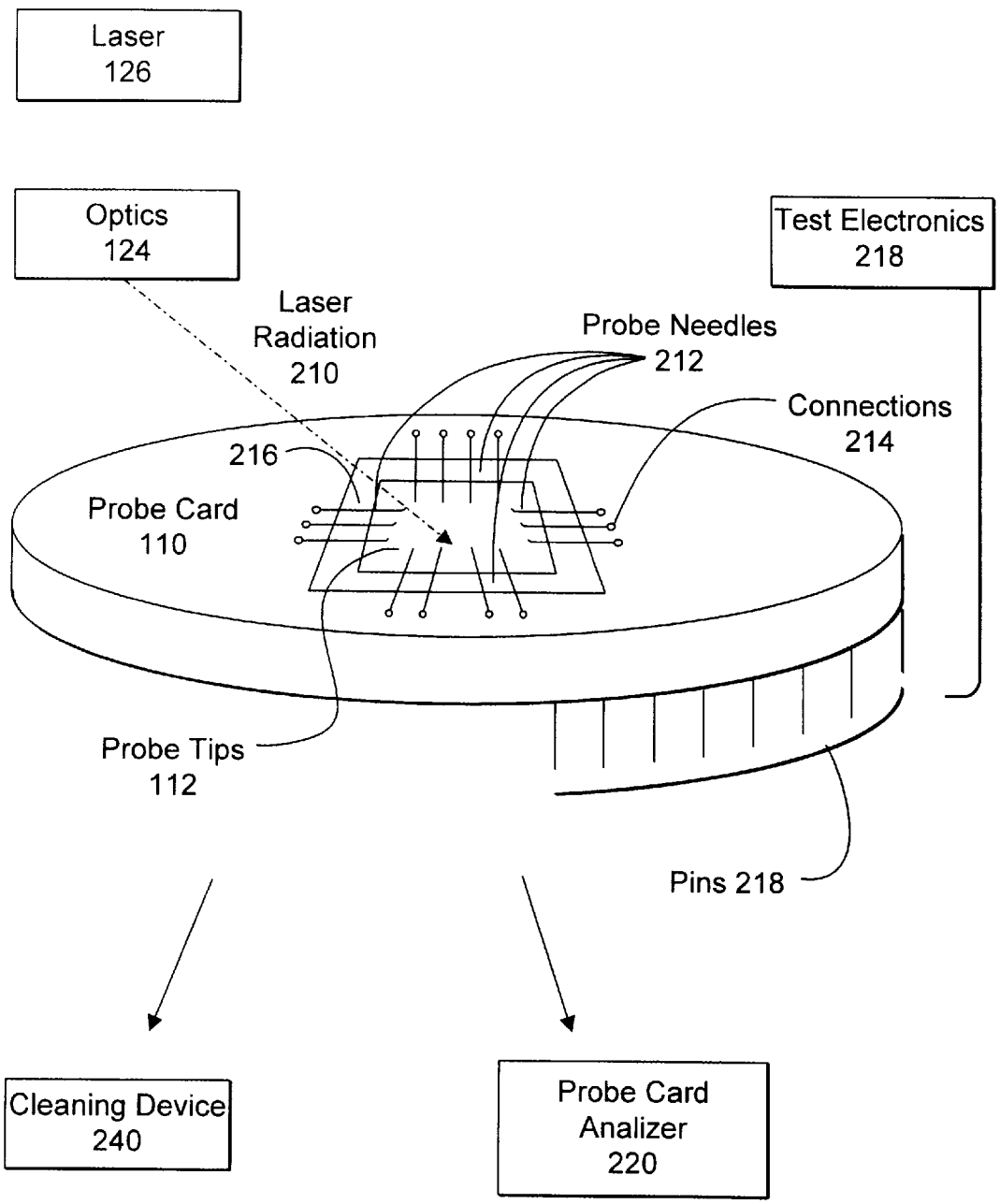
FIG. 2 is a schematical representation of a probe card with laser energy directed at the probe tips.

FIG. 2 is a schematical representation of an epoxy probe card with laser energy directed at the probe tips. Probe card 110 comprises a printed circuit board made from an epoxy resin. Probe card 110 includes probe needles 212, which are used to make electrical connection with the bonding pads of integrated circuits. The ends of probe needles 212 are the probe tips 112. The probe tips 112 contact and make electrical connection with the bonding pads of integrated circuits. Probe needles 212 are connected to circuitry on probe card 110 via connections 214. Support 216 holds probe needles 212 and helps to retain probe needles 212 in alignment. Probe needles 212 are arranged generally in a pattern such as a square or ring pattern, with probe tips 112 toward the center of the ring or square. One example of a probe card 110 is the Model S15/50 256-93/50 probe card provided by Accuprobe, which is located in Salem, Mass.

Tolerances on integrated circuits are small. Therefore, it is important that the probe needles 212 and probe tips 112 are in proper alignment when probe card 110 is used in an integrated circuit tester. Misalignment may cause probe tips 112 to fail to make an electrical connection with the bonding pads of the integrated circuits.

Laser radiation 210 originates from laser 126 and is directed through optics 124 to at least one probe tip among probe tips 112. Laser radiation 210 is directed to one probe tip at a time among probe tips 112. After a probe tip is cleaned, with laser radiation 210, the probe card 110 is moved relative to optics 124 so that another, not yet clean, probe tip can be cleaned with laser radiation 210. Alteratively, laser radiation 210 may be used to clean multiple probe tips among probe tips 112 simultaneously.

Probe tips 112 are shown in a square configuration. Alternatively, probe tips 112 may be arranged in another configuration, such as a combination of squares or other shape as required in order to allow probe tips to properly contact the bonding pads of the semiconductor.

Probe card 110 is coupled to test electronics 218 via pins 218. Additionally, pins 218 help to secure probe card 110 within a testing machine that includes probe card 110 and test electronics 218. Test electronics 218 are used to execute tests of an integrated circuit which is placed under probe card 110. Probe card 110 may be disconnected from test electronics 218 when probe tips 112 of probe card 110 are cleaned with laser radiation 210. Alternatively, laser 126 may be built into the testing machine so as to allow cleaning of probe tips 112 without removing probe card 110 from the test machine 218.

Probe card 110 may be removed from the testing machine in order to test the probe card 110 itself and to clean probe tips 112 as required. A specialized machine for testing probe cards, a probe card analyzer 220, may then be used for testing probe card 110. Analyzer 220 tests for alignment of probe needles 212 and for whether probe tips 112 are planar. Additionally, while probe card 110 is in analyzer 220, probe tips 112 are cleaned using laser radiation 210, according to the present invention. Before probe tips 112 are cleaned, they may be tested in analyzer 220. Probe tips 112 are then selectively cleaned depending on the results of the tests. For example, cleaning may be limited to probe tips whose contact resistance is outside of a particular range. Further, testing probe tips 112 while probe card 110 is in analyzer 220 allows for probe tips 112 to be reanalyzed after they are cleaned.

Alternatively, probe card 110 may be placed into cleaning device 240 for cleaning the probe tips, separate from analyzer 220. Cleaning device 240, which is a device dedicated to cleaning probe tips 112, may comprise components such as shown in FIG. 1. While probe card 110 is in device 240, laser radiation 210 is directed at probe tips 112 to remove debris.

A probe needle is made from a conductive material or combination of materials including a conductive material. For example, a probe needle may include a tungsten core with an outer layer to provide structure, such as beryllium copper, tungsten, or palladium.

Integrated circuits also may be tested using test fixtures other than epoxy probe cards having probe tips. For example, a test card containing a membrane with conductive contacts may be used to test an integrated circuit. Such a card is placed over the integrated circuit such that the contacts on the membrane come into contact with test pads on the integrated circuit. The integrated circuit is then tested using the card to provide an electrical connection from the membrane card to the integrated circuit. Other types of probe cards or test cards, such as a cobra card, may be used for testing integrated circuits. In a cobra card, the test probes tend to be oriented vertically compared to a ring probe card. Laser 126 may be directed to any such electrical contact on a card or other fixture in order to remove debris from the contact. An electrical contact includes, but is not limited to, a probe tip, an electrical contact on a membrane card, or other electrical contact for testing integrated circuits. A test card includes, but is not limited to, a probe card, membrane card, cobra card, or other card for testing integrated circuits.

Figure 3:
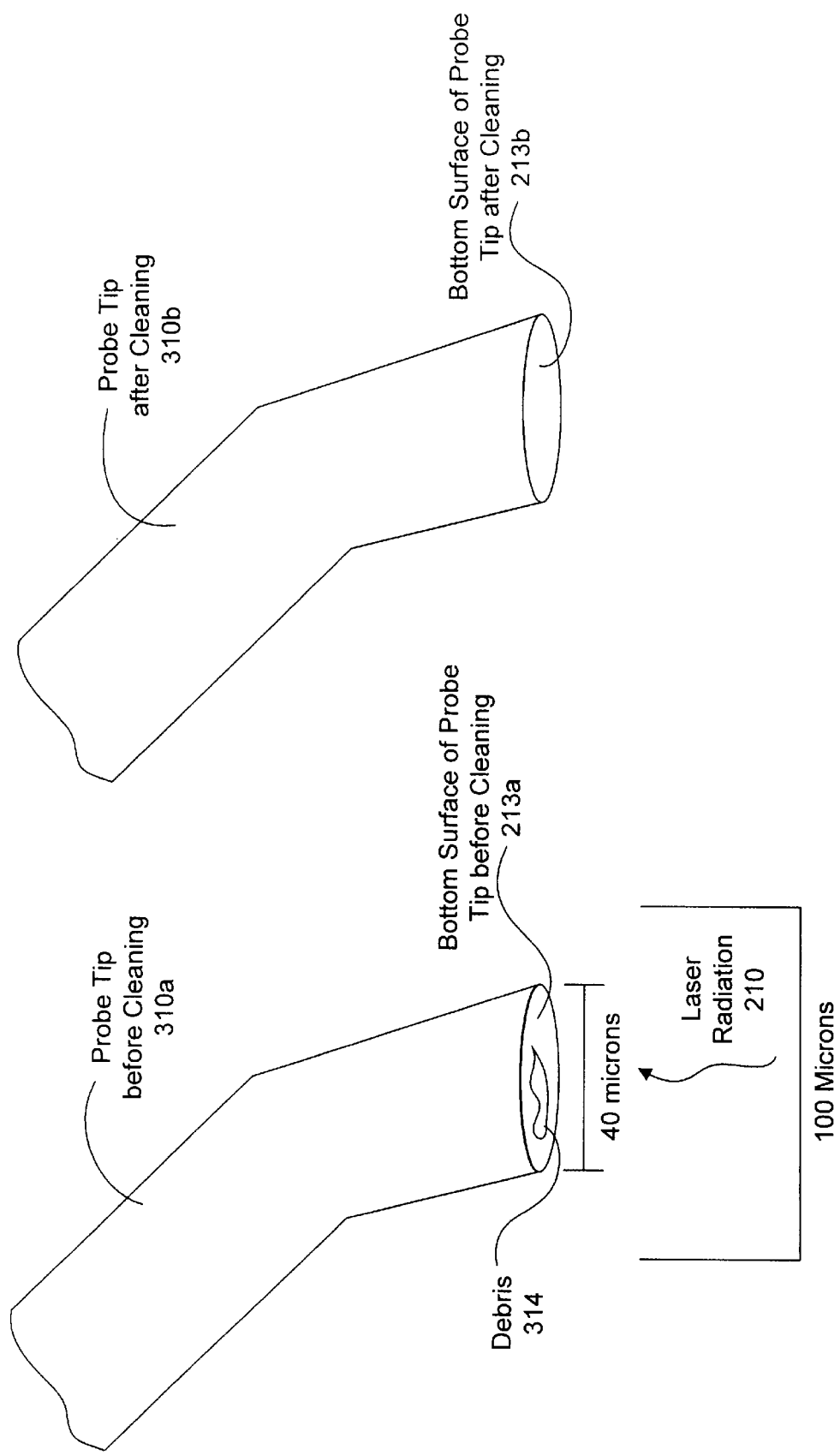
FIG. 3 is a schematical representation of a probe tip before and after cleaning with laser radiation.

FIG. 3 is a schematical representation of a probe tip before and after cleaning with laser radiation. FIG. 3 includes a probe tip before cleaning 310a and a probe tip after cleaning 310b. The bottom surface of probe tip before cleaning 312a includes debris 314. Debris 314 may include organic material, such as ink or polyimide. Debris 312 may alternatively include aluminum oxide ($Al_2O_3$), polyimide, silicon dioxide, nitride, or other material or combination of materials that interfere with conductivity between probe card 110 and an integrated circuit. The diameter of the bottom surface of probe tip 312a may be typically 25 microns to 80 microns. For example, bottom surface of probe tip 312a may be 40 microns.

Other portions of probe tip 310a other than bottom surface 312a may contain debris and may be cleaned with laser radiation 210. For example, sides of probe tip 310a may be cleaned with laser radiation 210.

Laser radiation 210 has a diameter of 100 microns. Diameter of laser radiation 210 allows for laser radiation 210 to irradiate bottom surface of probe tip 312a in order to clean it. A larger diameter for laser radiation 210 may allow for laser radiation 210 to clean more than one probe tip at a time. Laser radiation 210 is directed substantially in a normal (right angle) to bottom surface of probe tip before cleaning 312a.

Laser radiation 210 reacts with at least one of the probe tip 312a or debris 314 to cause removal of debris 312a from probe tip 312a. For example, laser radiation 210 may heat debris 314, heat probe tip 312a, heat both, or otherwise react with at least one of probe tip 312a or debris 314. If laser radiation 210 is absorbed by debris 314, it may heat up sufficiently to vaporize and thus be removed from probe tip 312a. Alternatively, laser radiation 210 may cause probe tip 312a to heat sufficiently to in turn heat and cause debris 314 to be removed from probe tip 312a. Other combinations of reactions and effects are possible so as to cause removal of debris 314.

FIG. 3 also shows probe tip after cleaning 310b including bottom surface of probe tip after cleaning 312b.

The wavelength and energy of laser radiation 210 is selected so as to clean debris 314 from bottom of the surface of probe tip before cleaning 312a. Further, the wavelength and energy of laser radiation 210 is selected so as to not destroy probe tip 310a.

Laser radiation 210 may be selected in the ultraviolet range of the electromagnetic spectrum in order to facilitate meeting the class I standard for devices using lasers.

Probe tip after cleaning 310b includes bottom surface of probe tip after cleaning 312b. Note that bottom surface 312b does not include debris 314.

Laser wavelength or power may be selected to be sufficient to cause partial melting of probe tip 310a. Such partial melting of probe tip 310a may help to improve reduction of contact resistance of probe tip 310a. For example, radiation from the green range of the electromagnetic spectrum (e.g., 532 nanometers) may be directed at probe tip 310a to help cause at least partial melting of probe tip 310a.

Laser radiation 210 may be selected to be sufficient to cause the contact resistance of probe tip 310 to reach the level of less than 5 Ohms. Also, laser radiation 210 may be selected to cause probe tip 310a to achieve a contact resistance less than 2 Ohms or substantially to 1 Ohm. Contact resistance is the resistance between the probe tip and the device contact surface metalization.

Figure 4:
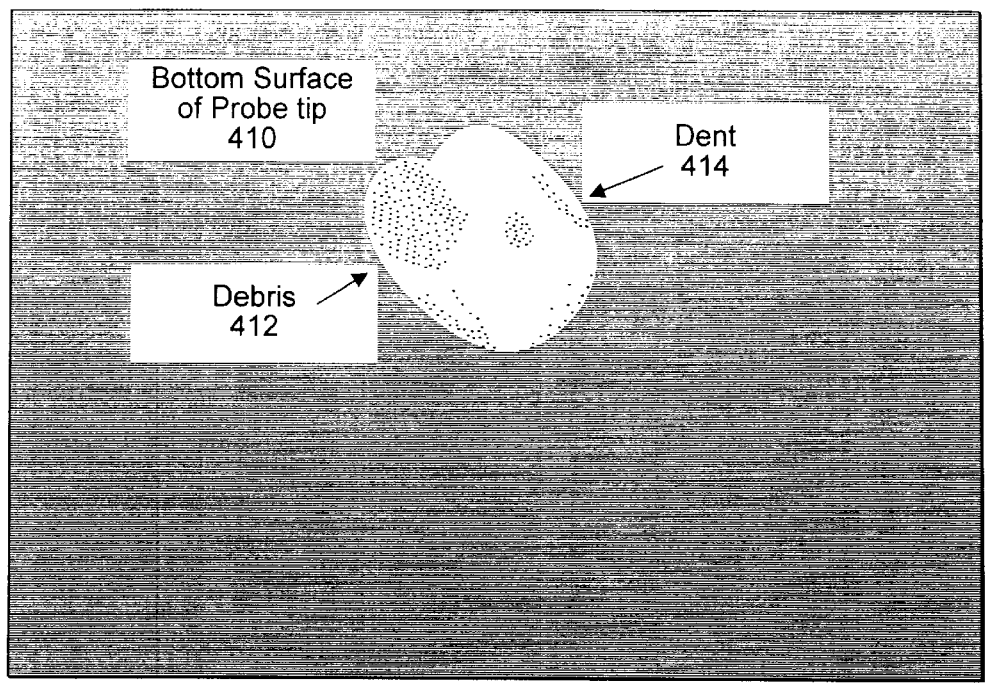
FIG. 4 shows a probe tip before and after cleaning with laser radiation.
Figure 4:
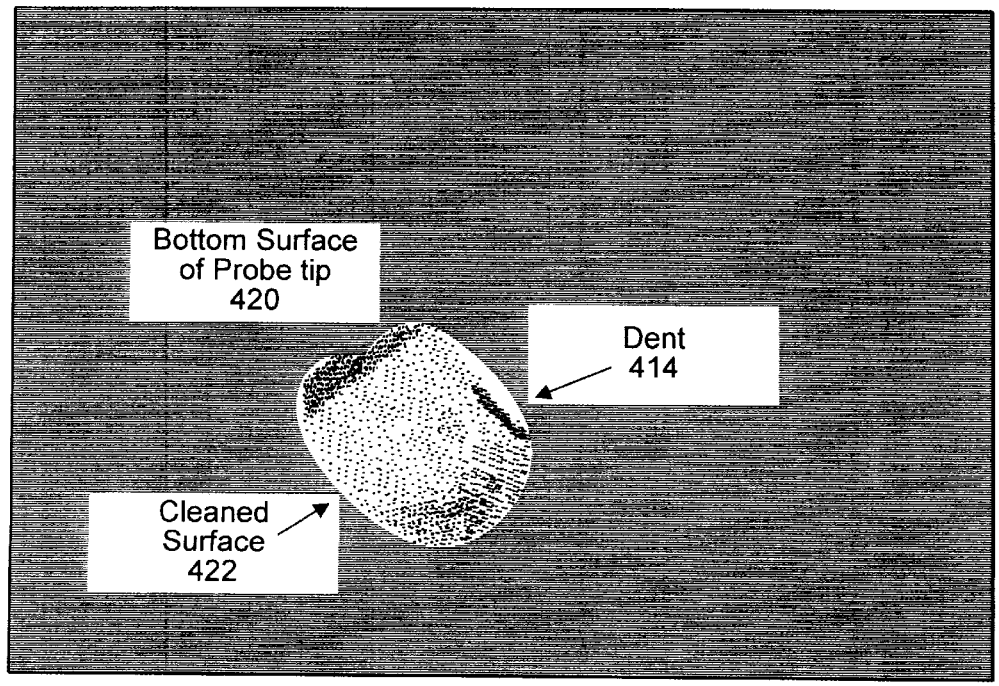

FIG. 4 shows a probe tip before and after cleaning with laser radiation. FIG. 4 includes the bottom surface of probe tip 410 before cleaning and bottom surface of probe tip 420 after cleaning. Although probe tip 410 is shown having a flat surface, probe tip 410 may alternatively have other shapes. For example, probe tip may have a curved surface or a surface with angles. Probe tips may also have shapes referred to as radius, semi-radius, sharp, or other shape. Bottom surface of probe tip 410 before cleaning includes debris 412. Bottom surface of probe tip 420 after cleaning does not include debris 412 and shows a cleaned surface 422. Dent 414 remains on cleaned surface 422.

Figure 5:
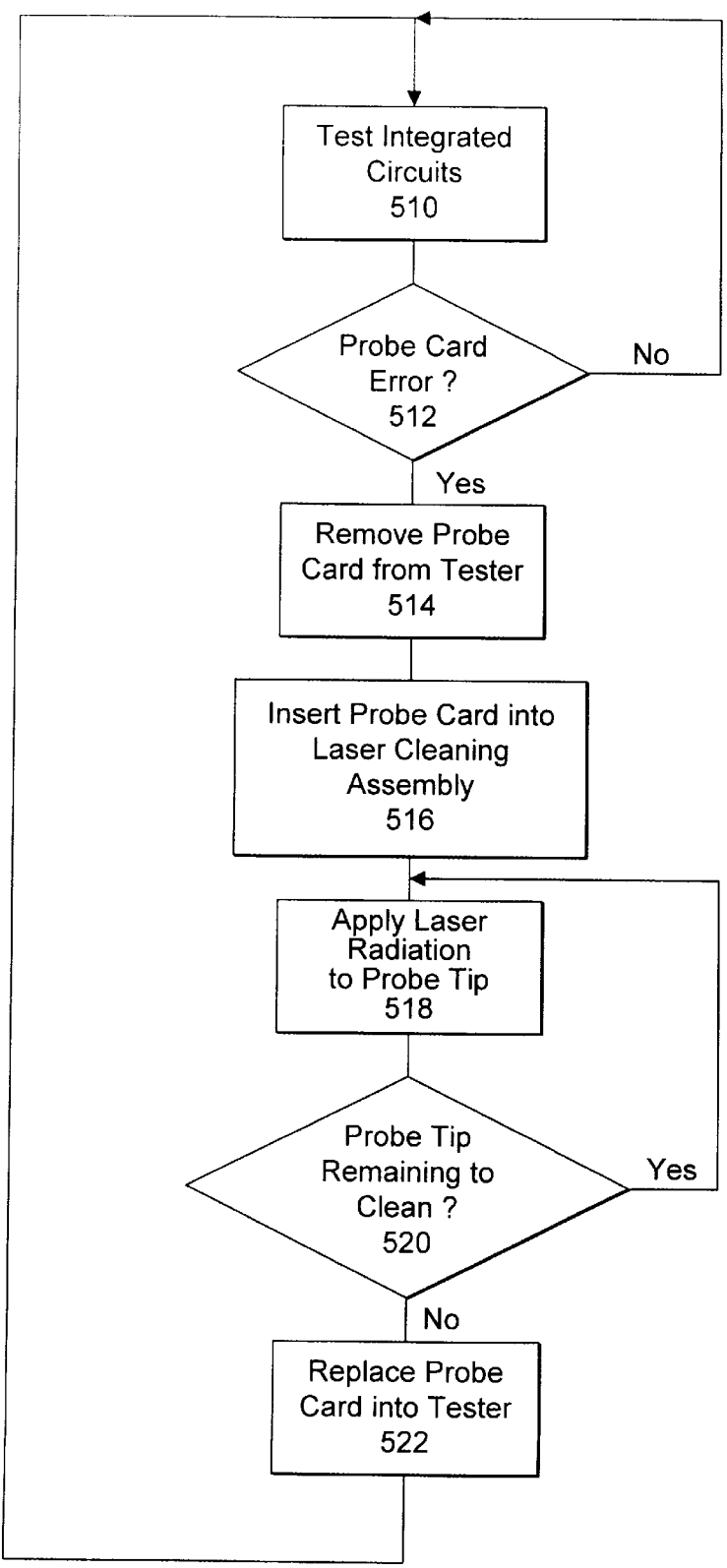
FIG. 5 is a flow chart of a method of testing integrated circuits using probe cards cleaned according to an embodiment of the present invention.

FIG. 5 is a flow chart of a method of testing integrated circuits using probe cards cleaned according to an embodiment of the present invention. Integrated circuits are tested using a probe card in an integrated circuit tester (block 510). If no probe card error is detected (block 512), then continue to test integrated circuits (block 510). If an error is detected, remove the probe card from the tester (block 514). Removing the probe card from the tester allows the probe card to be analyzed and cleaned so that it may be reused. Insert the probe card into laser probe card cleaning device (block 516). The probe card may also be analyzed with a probe card analyzer at this time. A probe card analyzer may be used to identify probe tips that have a contact resistance outside a particular operating range. Then the operator may clean only those probe tips that are outside the particular range. An operating range may be, for example, 0 Ohms to 5 Ohms, 0 Ohms to 2 Ohms, 0 Ohms to 1 Ohm, or other range or subrange, depending on operating requirements. Testing probe tips for contact resistance and then only cleaning probe tips that are outside a particular operating range helps to save time and wear due to cleaning of probe tips.

Next, apply laser radiation to the probe tip (block 518). The laser radiation is applied to the probe tip in order to remove debris from the probe tip thus cleaning the probe tip. The cleaned probe tip is to have a lesser contact resistance and, therefore, allow for a probe tip to be used again in testing an integrated circuit. After laser radiation is applied to a probe tip in block 518, the operator determines whether more probe tips remain to be cleaned (block 512). If more probe tips remain to be cleaned, then laser radiation is applied to an additional probe tip in block 518. If no probe tips remain to be cleaned, then the probe card may be placed into tester (block 522). In this manner probe tips are cleaned one by one. Alternatively, multiple probe tips may be cleaned simultaneously.

Figure 6:
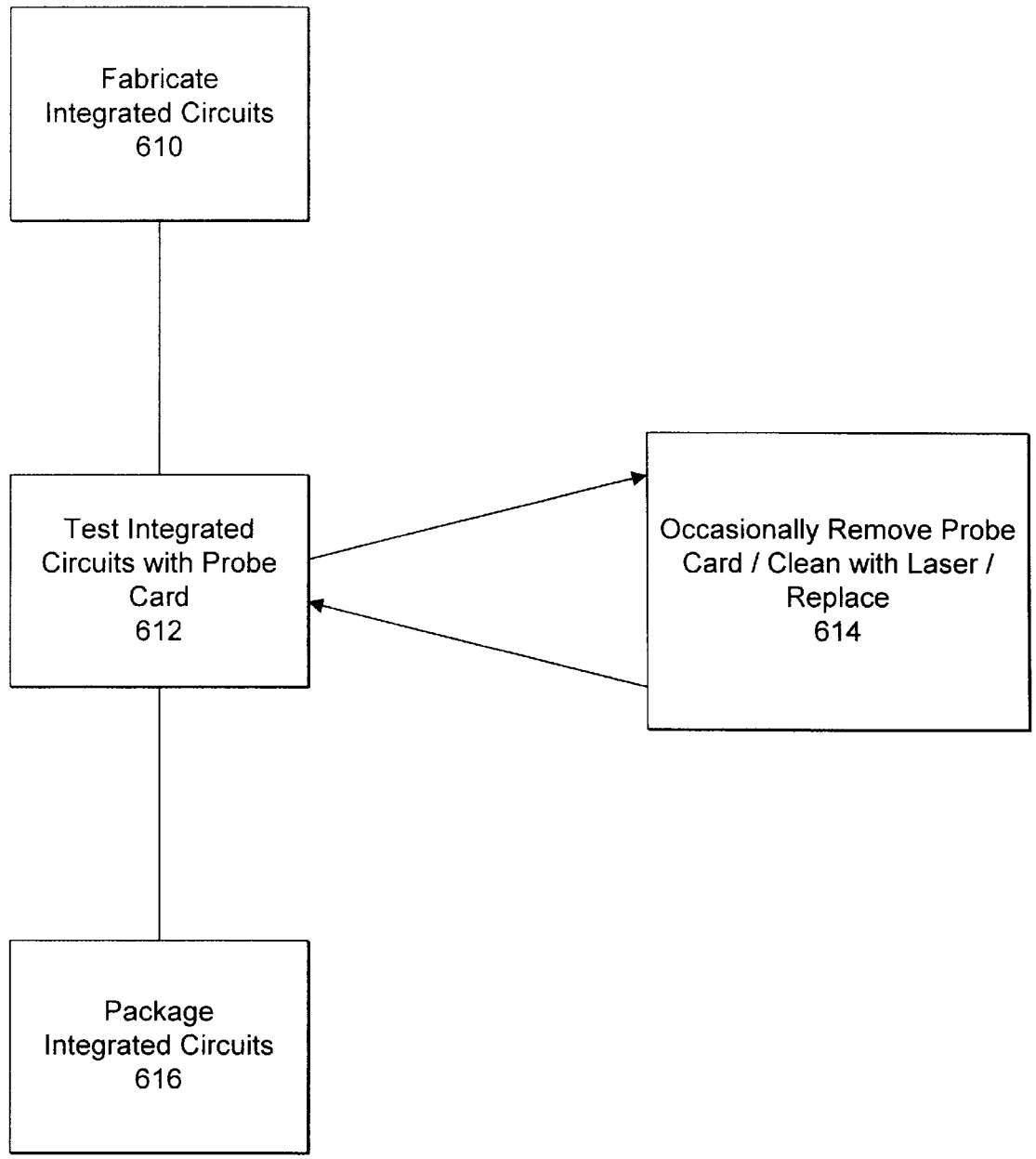
FIG. 6 is a flow chart of a process of manufacturing integrated circuits using probe cards cleaned with laser radiation according to an embodiment of the present invention.

FIG. 6 is a flow chart of a process of manufacturing integrated circuits using probe cards cleaned with laser radiation according to an embodiment of the present invention. First, integrated circuits are fabricated (block 610). Next, the integrated circuits are tested in an integrated circuit tester using a probe card (block 612). Over time, the probe tips of a probe card accumulate debris. Eventually, an error is detected in a probe card. At this time, remove the probe card and clean the probe tips with a laser. Then replace the probe card in the integrated circuit tester (block 614). After cleaning the probe card, resume testing the integrated circuits with the probe card in block 614. After integrated circuits are tested, package the integrated circuits (block 616).

The foregoing description of embodiments of the invention has been provided for the purposes of illustration and description. It is not intended to be exhaustive or to limit the invention to the precise form disclosed. Many modifications and variations will be apparent. The embodiments were chosen and described in order to best explain the principles of the invention and its practical application, thereby enabling others to understand the invention for various embodiments and with various modifications as are suited to the particular use contemplated. It is intended that the scope of the invention be defined by the following claims and their equivalents.

What is claimed is:

1. A device for cleaning electrical contacts on test cards, the device comprising:

a solid state laser configured to deliver a set of pulses;

microscope optics optically coupled to the laser; and a test card holder positioned relative to the optics allowing the set of pulses from the laser passing through the optics to be directed onto a contact on a test card positioned in the test card holder, wherein the foregoing are configured to deliver radiation from the laser at a level sufficient to at least partially melt conductive material of the test contact.

2. A method for cleaning electrical contacts on test cards, the method comprising:

obtaining a solid state laser configured to deliver a set of pulses;

optically coupling microscope optics to the laser; and positioning a test card holder relative to the optics allowing the set of pulses from the laser passing through the optics to be directed onto a contact on a test card positioned in the test card holder; and delivering radiation from the laser at a level sufficient to cause melting of conductive material of the test contact.

* * * * *